United States Patent [19]

Kato et al.

[11] 4,446,168
[45] May 1, 1984

[54] METHOD OF FORMING AMORPHOUS SILICON

[75] Inventors: Kazuhisa Kato, Atsugi; Hiroyuki Yagami, Machida, both of Japan

[73] Assignee: Stanley Electric Co., Ltd., Tokyo, Japan

[21] Appl. No.: 363,236

[22] Filed: Mar. 29, 1982

[30] Foreign Application Priority Data

Apr. 3, 1981 [JP] Japan ................................. 56-49299

[51] Int. Cl.$^3$ ............................................. H01L 45/00
[52] U.S. Cl. ...................................... 427/39; 427/85; 427/86; 427/88
[58] Field of Search ...................... 427/39, 85, 86, 88

[56] References Cited

U.S. PATENT DOCUMENTS 4,064,521  12/1977  Carlson ............................. 427/39 X Primary Examiner—James R. Hoffman
Attorney, Agent, or Firm—Spensley, Horn, Jubas & Lubitz

[57] ABSTRACT

A method of forming, through plasma chemical vapor deposition technique, an amorphous silicon film, one side thereof intended for ohmic contact with specifically an aluminum electrode in a semiconductor device, comprising the steps of: introducing a starting gas containing at least a silicon-containing gas into an evacuated container; and subjecting said gas to plasma chemical vapor deposition through a glow discharge at a power density of 0.3 W/cm$^2$ or greater. The particular a-Si region thus obtained provides a good ohmic contact with an aluminum electrode which is low in price and in melting point but high in reliability. In case an active a-Si region is desired, it is only necessary to lower the power density to a level below 0.3 W/cm$^2$.

13 Claims, 4 Drawing Figures

METHOD OF FORMING AMORPHOUS SILICON

BACKGROUND OF THE INVENTION

1. (a) Field of the invention

The present invention relates to a method of forming amorphous silicon which is a semiconductor material for use in various kinds of semiconductor devices, and in particular to a method of forming amorphous silicon which is capable of providing good ohmic contact in case aluminum which is a most popular electrode metal when it is intended to produce an ohmic contact on a semiconductor device is used as an electrode for ohmic contact with amorphous silicon.

2. (b) Description of the prior art:

As is well known, amorphous silicon (hereinafter to be briefed as "a-Si") as a semiconductor material has recently been attracting the attention of the concerned as being a semiconductor material having a wide range of applications, being usable in various kinds of semiconductor devices or equipments, and its development is making a progress intensively. Its practical applications are also under way. The reasons for the high applicability of amorphous silicon may be as follows.

To begin with, the electrical characteristics of this a-Si can be varied widely by appropriately selecting its forming conditions, so that the degree of its semiconducting, insulating and photo-conducting properties can be controlled as desired. Since an a-Si is not a single crystal, there is no longer the need to consider such aspects as regularity of lattice or possible lattice mismatch relative to other semiconductor material, and this permits one to use a-Si mainly for the formation of thin films, which leads to enhancing the freedom not only in the designing of a semiconductor device but also in the size of the device, the device constitution and the device-fabricating process.

As such, there have already been developed various kinds of semiconductor devices and equipments employing an a-Si to serve as an active semiconductor material. Their typical examples include solar battery, image sensor, photo-sensor and thin film transistor. Also, consideration is being paid to the employment of an a-Si to serve as an insulator to form a protection film therewith. Especially, a solar battery using an a-Si is recently regarded to have a quite promising future in that the battery is a device manufactured at low cost and possesses a large active area and provides a high production yield.

This a-Si can be produced by any one of the various methods including vacuum evaporation, sputtering, reactive sputtering, and plasma chemical vapor deposition. Among these methods, the most typical method of its production is the so-called plasma chemical vapor deposition method which allows one to design, with a considerable freedom, the mechanical and/or electrical characteristics of a thin film of a-Si.

Hereunder will be described a method of forming an a-Si film by relying on the plasma chemical vapor deposition (hereinafter to be briefed as P-CVD) method, i.e. by decomposition of $SiH_4$ gas by glow discharge with electric power of radio frequency (AC) or with electric power of direct current (DC).

One example of the apparatus for forming an a-Si film is shown in FIG. 1. The process of forming an a-Si film will be described by referring to FIG. 1. Numeral 1 represents a substrate such as a glass plate. Two plate electrodes 2 and 3 are positioned to face each other at a distance therebetween within a reaction chamber 4 which communicates a vacuum system 6. Said substrate 1 for use in the formation of an a-Si film is placed on one 2 of the plate electrodes 2 and 3. To this plate electrode 2, there may be additionally provided a heater 5 as required. In order to enhance the uniformity of the a-Si film which is to be produced, it is desirable to rotate the plate electrode 2 by a motor 11.

The apparatus includes a reaction chamber 4 and also includes a gas supply system which is provided separately from the reaction chamber 4 and is comprised of a gas chamber 9 containing $SiH_4$ therein, another gas chamber 10 containing such impurity gas as $PH_3$, and a gas supply controller 8 for controlling the flow rate and/or the ratio of gases to be mixed. The fluid such as air which may be present in the interior of the reaction chamber 4 is evacuated preliminarily by means of the vacuum system 6. Thereafter, a gas or a mixed gas is conducted from said gas supply system into the reaction chamber 4 through appropriate piping. Such gas is supplied uniformly onto the substrate 1 through a number of small perforations formed through the plate electrode 3 which is disposed to oppose the plate electrode 2 within the reaction chamber 4.

At the time a gas is supplied into the reaction chamber 4, an electric power is applied across the plate electrodes 2 and 3 from an external power supply 7, so that there is produced a glow discharge within the reaction chamber 4, with the result that $SiH_4$ or a mixture of $SiH_4$ and $PH_3$ is decomposed, and an a-Si is deposited on the substrate 1.

The electric power which is applied to the apparatus may be a direct current (DC) or an alternate current (AC) of the order of radio frequency, or their superposition, depending on the desired property of the a-Si film which is to be produced.

The method mentioned above has many features such that the temperature of the substrate can be set low; that the forming process can be simplified in that, by substituting the impurity gases, a pn junction can be formed by the same forming steps; that the thickness of the a-Si film can be controlled as desired; and that a film having a large area can be easily obtained.

As stated earlier in this specification, the a-Si film which is thus obtained is considered to be very promising as a new semicondutor material, and its practical use has started in some limited fields. However, the controlling of such aspects as the growth mechanism, defects, content of hydrogen atoms, impurity and carrier mobility of an a-Si film still leaves many points that require elucidation and solution, and their analysis is demanded.

For example, the content of hydrogen atoms is considered to affect the characteristics of an a-Si film for the following reasons. It will be appreciated that an a-Si film produced from decomposition of $SiH_4$ should contain hydrogen atoms. These hydrogen atoms will combine the dangling bond of silicon so that it will be able to reduce such density of localized level, i.e. the density of such dangling bond, which traps or releases carriers in an a-Si. As a result, it is considered to be possible to form a pn junction with an a-Si film. As such, the presence and the volume of these hydrogen atoms will largely contribute to the property of the a-Si film. Also, in case $SiF_4$ is employed inplace of $SiH_4$ for the formation of an a-Si film, it should be appreciated that fluorine atoms will be contained in the a-Si film produced. In the similar way as for $SiH_4$, the presence and the volume of fluorine atoms will become problematical. However, it has been said that there is a difference between the influence of the hydrogen atoms and that of the fluorine atoms relative to the property of an a-Si film. Comparison therebetween has now become an important task of the concerned.

Now, in case a semiconductor device or equipment is constructed by using an a-Si film to serve as an active material, there arises the necessity for forming an electrode on such device by the employment of such metal as will allow the provision of an ohmic contact on the a-Si film.

The conditions which are required of an electrode metal for the provision of an ohmic contact on a semiconductor device include, as are well known, small resistivity, lack of rectifying property relative to a semiconductor material (absence of electrical potential barrier for carrier flow), lack of possibility to become an injection source of minority carriers, lack of capability to react against a semiconductor material, absence of migration of electrode metal at the surface or into the interior portion of a semiconductor, and easiness of handling.

Such demands as mentioned above have led to the consideration to use Pd or Pt having a relatively large work function for the formation of a p type a-Si film, though high in cost, and to use such metal as Al or Mo having a relatively small work function for the formation of an n type a-Si film.

Also, in case a transparent electrode is needed for the transmission of light rays, there are considered to use, for example, $In_2O_3$, $SnO_2$ and I.T.O. (Indium Tin Oxide).

It should be understood as a matter of course that a portion of the a-Si region which is brought into contact with such electrode as mentioned above is made into a highly-doped $n^+$ type a-Si region or a $p^+$ type a-Si region by the use of an impurity gas such as $PH_3$ or $B_2H_6$. Among those electrode materials mentioned above which are used for the provision of an ohmic contact, aluminum not only satisfies the abovesaid various requirements but also is a material having sufficient good results in the past in that: it allows one to form an electrode film by a simple technique; that it has a good adhering property; that it is a material available at low cost; that it allows an easy bonding of a lead wire; and that is has a high reliability. It is desirable to use aluminum for an a-Si film from the abovesaid aspect also, and thus various attempts have been made so far. However, aluminum has not yet been used as a material, in practice, to obtain a stable ohmic contact.

For example, by relying on a method and apparatus as shown in FIG. 1, there was formed a construction as shown in FIG. 2, i.e. an n type a-Si layer 12 is flanked at both sides thereof by two layers 13 and 13a for ohmic contact which are formed by a material such as Mo, Al and I.T.O. The I-V characteristic of the resulting device was measured, and the result is shown in FIG. 3.

As one of the forming conditions of a-Si film mentioned just above, the ratio between $PH_3$ and $SiH_4$ was $PH_3/SiH_4=0.001$. Although an a-Si film has a considerably low resistivity, the instance wherein an electrode metal was Mo and an instance wherein it was I.T.O. showed such characteristics that a good ohmic contact was obtained invariably. In case of aluminum as the electrode material, a non-ohmic contact characteristic, i.e. a rectifying characteristic, was exhibited. Furthermore, when the abovesaid ratio was increased to: $PH_3/SiH_4=0.01$ to provide a highly-doped $n^+$ type a-Si, the result was that in case of aluminum as the electrode metal, a rectifying characteristic was exhibited in most cases as in the preceding example.

As discussed above, in spite of the fact that aluminum is a very desirable electrode material, it has yet been an unsatisfactory material for a-Si.

SUMMARY OF THE INVENTION

It is, therefore, the object of the present invention to provide a method of producing such a-Si film that allows the use of aluminum to serve as a stable and satisfactory electrode metal of ohmic contact for said film, by setting specific conditions for the formation of the a-Si film, thereby eliminating the drawback of the prior art that aluminum has not been considered a satisfactory material for producing an ohmic contact for an a-Si film.

DETAILED DESCRIPTION OF THE PREFERRED EMBODIMENTS

The reason that no good ohmic contact has been obtained when aluminum is used as an electrode material on an a-Si film of the prior art even by varying the ratio between $SiH_4$ gas and $PH_3$ gas as discussed above has been inferred to be due to the impurity concentration within the a-Si film. Because of this consideration, experiments were conducted by using various different conditions of producing a-Si films, thinking that some other production conditions rather than said ratio may contribute to the abovestated results of the prior art. It has been discovered that the grade of the ohmic contact of a-Si film with aluminum electrode has strongly depended on the density of the electric power used for generating a glow discharge which causes a decomposition of $SiH_4$ when an a-Si film is produced, rather than on said impurity concentration within the a-Si film.

In case an a-Si film is produced, the density of the electric power which is used to cause a glow discharge is usually about $0.1 W/cm^2$ on silicon when this density is considered in term of unit area of that electrode which mainly contributes to the generation of this glow discharge. However, if the areas of the opposing two electrodes which cause a glow discharge are different from each other, or if there is a substantial distance between these opposing electrodes, no uniform glow discharge phenomenon will take place on the entire surfaces of the electrodes as will be readily understood.

Furthermore, in such case, the power density will not become uniform either. On the other hand, there is the demand that the property of an a-Si film be uniform on the entire surface of the substrate. Therefore, the size of the electrodes and other parts require to be designed to produce this aimed object. The abovementioned value of power density, i.e. $0.1W/cm^2$, is the one for causing a glow discharge on a unit area of that electrode which contributes to said glow discharge when an a-Si film is to be formed on a substrate.

Figure 3:
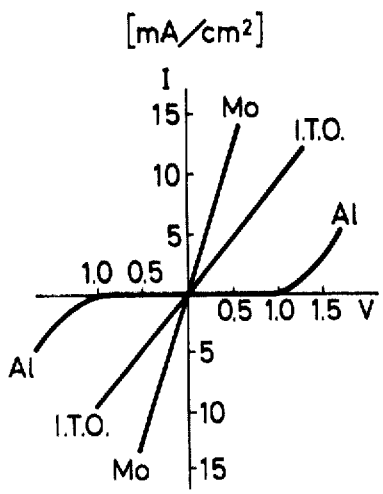
FIG. 3 is a chart showing the I-V characteristic measured of a device structure of FIG. 2 wherein the a-Si film is produced in accordance with the prior method and wherein the electrode material is Mo, Al or I.T.O., respectively.

Though not mentioned in the description of the prior art, the result of the I-V characteristic shown in FIG. 3 when aluminum is used as an ohmic contact electrode material is that obtained by increasing the discharge power density to $0.2W/cm^2$ than the conventional $0.1W/cm^2$.

Figure 1:
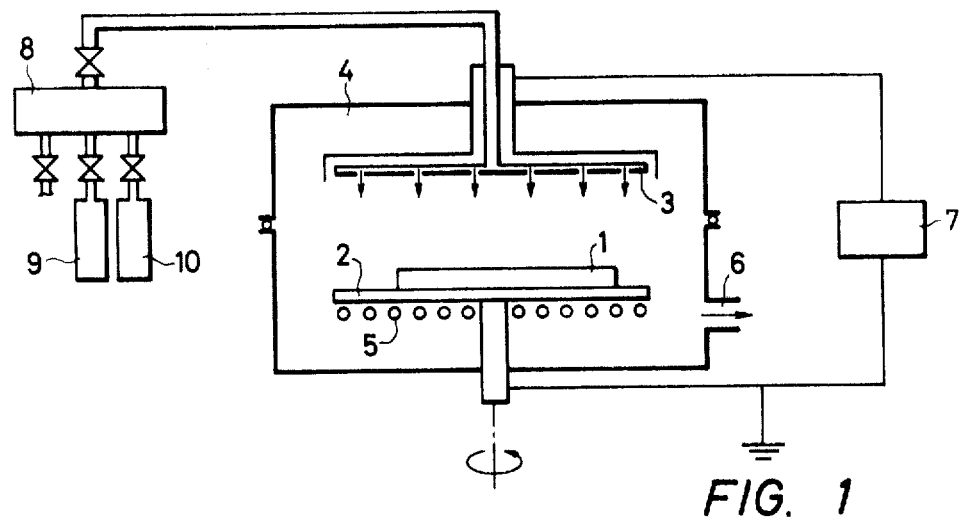
FIG. 1 is a schematic illustration showing an apparatus for use in forming an a-Si film on a substrate by decomposition of, for example, $SiH_4$ through glow discharge.
Figure 2:
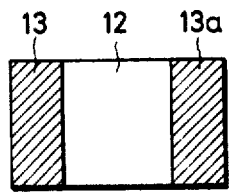
FIG. 2 is a diagrammatic illustration of a device structure for use in taking an I-V characteristic of this device to evaluate the contact characteristic of electrode material on an a-Si film.
Figure 4:
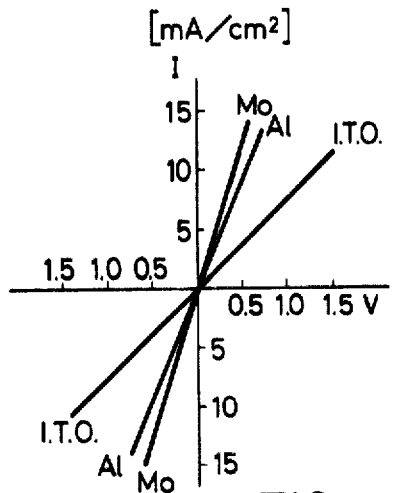
FIG. 4 is a chart showing the I-V characteristic measured of a device structure of FIG. 2 wherein the a-Si film is produced in accordance with the method of the present invention and wherein the electrode material is Mo, Al or I.T.O., respectively.

Conditions for producing an a-Si film have been varied in many ways for experimental purpose. For example, the gas pressure within the reaction chamber was varied by controlling the value of the evacuation system which was connected to the reaction chamber. However, no improved ohmic contact for an a-Si film was obtained from the use of aluminum metal as an ohmic contact electrode for the a-Si film. It has been found, however, that, in case the power density for causing a glow discharge is substantially $0.3W/cm^2$ or thereabove for the formation of an a-Si film, the use of aluminum as an electrode material on the a-Si film thus obtained shows a stable ohmic contact and a good repetitivity. The reason therefor is not known yet decisively. It may be inferred, however, that such phenomenon is explained by the changes of the property of the a-Si film which have been brought about through an increase in the power density for a glow discharge. More particularly, it was considered that by increasing the glow-discharge power density which was employed for the formation of an a-Si film, the bonding condition of (a) the amount of these hydrogen atoms which are present within the a-Si film formed and of (b) silicon varied, so that the amount of $[SiH_2]_n$ increased than the amount of $[SiH]_n$ which were the compounds contained in the a-Si body, and whereby the property of the a-Si film underwent a change. FIG. 4 shows the result of measurement of the I-V characteristic of an a-Si film by using the device structure shown in FIG. 2 in case the a-Si film is produced with a power density of $0.3W/cm^2$ or higher for the glow discharge.

As will be noted in the drawings, a good ohmic contact is obtained by the use of Mo or I.T.O. when the a-Si film is produced through a glow discharge at a power density of $0.2W/cm^2$ as shown in FIG. 3. However, no good ohmic contact is obtained when aluminum is used as an electrode material for ohmic contact. Whereas, in case the a-Si film is produced through a glow discharge at a power density of $0.3W/cm^2$ or greater, a satisfactory ohmic contact is obtained not only with Mo or I.T.O. but also with aluminum to serve as the electrode material for such a-Si film.

For the abovestated reason, in case it is intended to obtain an a-Si film through the decomposition of $SiH_4$ by glow discharge, it is only necessary to set the power density at that electrode mainly causing a glow discharge to substantially $0.3W/cm^2$ or greater.

It should be understood, however, that in case the a-Si film thus formed is used to constitute an active region in a semiconductor device, an increase in the power density for glow discharge, i.e. $0.3W/cm^2$ or higher, will result in a degradation of such properties as the photo-conductivity of a semiconductor device and the current characteristic of a diode. This is considered to be due to an increase in the number of those compounds having the bond condition of $[SiH_2]_n$ within the a-Si film, as discussed above. As an example, in case a diode is prepared, it should be noted that, with an a-Si film obtained through a glow discharge at a power density of the order of $0.1W/cm^2$, the "n" factor in the current characteristic of the diode is fairly good, being n=about 1.2–1.5. However, with an a-Si film obtained through a glow discharge done at the power density of the order of $0.3W/cm^2$, the "n" factor will be n=about 2. Accordingly, in order to effectively display the effect and advantage of the present invention, it is necessary to form that portion of the a-Si film which is required to have a certain thickness, by a glow discharge at a low density of power, whereas only that portion of the a-Si film of a certain thickness which is to be brought into contact with an aluminum electrode should be formed through a glow discharge at a power density of $0.3W/cm^2$ or higher.

Description has been made above with respect to the effect and advantage of the present invention by referring to the instance of an n type a-Si film. Exactly the same effect and advantage can be obtained in a p type a-Si film which is produced by the use of such substance as $B_2H_6$.

It should be understood that by virtue of the present invention, there is no longer required to use an expensive metal such as molybdenum having a high melting point to form an electrode for ohmic contact with an a-Si film, but the present invention permits the use of aluminum to form an electrode, which is low in cost and has a low melting point and which is high in operation reliability. Furthermore, the present invention allows one to enhance the property of the active region of an a-Si film by independently forming this region relative to other regions. Thus, the efficiency, for example, of the device can be improved. Also, in case a device is prepared by forming an a-Si film, the changing of the conditions of forming an a-Si, e.g. the changing of location of an active region and an ohmic region, can be achieved simply by varying the power density for the glow discharge. Thus, the process of forming an a-Si film will not become complicated.

What is claimed is:

1. For use in the production on a substrate of a semiconductor device through plasma chemical vapor deposition technique, a method of forming an amorphous silicon film, one side of this film being intended for ohmic contact with a metal electrode to provide an ohmic contact, comprising the steps of:
   placing said substrate in an evacuated container;
   introducing a starting gas containing at least a silicon-containing gas into said evacuated container; and
   subjecting said gas in said chamber to a glow discharge at a power density of substantially $0.3W/cm^2$ or greater, thereby causing an amorphous silicon film to deposit onto said substrate.

2. A method according to claim 1, in which: said starting gas is silane ($SiH_4$) gas.

3. A method according to claim 1, in which: said starting gas is a mixed gas consisting of a silane gas and a phosphine ($PH_3$) gas.

4. A method according to claim 1, in which: said starting gas is a mixed gas consisting of a silane gas and a diborane ($B_2H_6$) gas.

5. A method according to claim 1, in which: said metal is aluminum.

6. A method according to claim 1, in which:
said plasma chemical vapor deposition is conducted by the use of an apparatus comprising:
an evacuable closed chamber containing therein opposing electrodes operably connected to a power supply and intended for causing a glow discharge, and a substrate placed on one of said opposing electrodes.

7. A plasma chemical vapor deposition process for forming an amorphous silicon film, wherein the plasma chemical vapor deposition process includes the steps of:
introducing a silicon-containing gas into a chamber containing a substrate; and
subjecting said gas to glow discharge at a power density of approximately at least 0.3W/cm.$^2$ or greater, thereby causing formation of said film onto said substrate by plasma chemical vapor deposition.

8. A process for forming a film as described in claim 7, wherein said silicon-containing gas is silicon tetrafluoride ($SiF_4$).

9. A process for forming film as described in claim 7, wherein said gas contains silane ($SiH_4$).

10. A process for forming a film as described in claim 7, wherein said process further includes depositing a layer of aluminum on top of said amorphous silicon film.

11. A process for forming a film as described in claim 10, wherein said gas includes a dopant material.

12. A method according to claim 1 comprising the further step of:
providing a metal electrode atop said amorphous silicon film, said film making good electrical connection between said metal electrode and an active device region of said substrate beneath said film.

13. A method according to claim 12 wherein said active device region comprises an amorphous silicon active material.

* * * * *